United States Patent
Kanaya

(10) Patent No.: US 8,228,482 B2
(45) Date of Patent: Jul. 24, 2012

(54) EXPOSURE APPARATUS, EXPOSURE METHOD, AND DEVICE MANUFACTURING METHOD

(75) Inventor: Yuho Kanaya, Kumagaya (JP)

(73) Assignee: Nikon Corporation, Tokyo (JP)

( * ) Notice: Subject to any disclaimer, the term of this patent is extended or adjusted under 35 U.S.C. 154(b) by 532 days.

(21) Appl. No.: 12/463,586

(22) Filed: May 11, 2009

(65) Prior Publication Data
US 2009/0284716 A1 Nov. 19, 2009

Related U.S. Application Data

(60) Provisional application No. 61/071,694, filed on May 13, 2008.

(51) Int. Cl.
G03B 27/52 (2006.01)
G03B 27/58 (2006.01)
G03B 27/42 (2006.01)
G03B 27/32 (2006.01)

(52) U.S. Cl. .......... 355/30; 355/53; 355/72; 355/77

(58) Field of Classification Search .......... 355/30, 355/52, 53, 55, 67–71, 72–74, 77; 250/492.1, 250/492.2, 492.22, 548; 430/5, 8, 22, 30, 430/311, 320; 356/399–401
See application file for complete search history.

(56) References Cited

U.S. PATENT DOCUMENTS

| | | | |
|---|---|---|---|
| 4,780,617 A | 10/1988 | Umatate et al. | |
| 5,196,745 A | 3/1993 | Trumper | |
| 5,448,332 A | 9/1995 | Shakakibara et al. | |
| 5,610,715 A | 3/1997 | Yoshii et al. | |
| 5,646,413 A | 7/1997 | Nishi | |
| 5,969,441 A | 10/1999 | Loopstra et al. | |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,819,425 B2 | 11/2004 | Kwan | |
| 7,023,610 B2 | 4/2006 | Ohtsuki et al. | |

(Continued)

FOREIGN PATENT DOCUMENTS

CN 1932650 A 3/2007

(Continued)

OTHER PUBLICATIONS

Jan. 5, 2012 Office Action issued in CN Application No. 200980117085.9 (with English translation).

(Continued)

Primary Examiner — Edward Glick
Assistant Examiner — Christina Riddle
(74) Attorney, Agent, or Firm — Oliff & Berridge, PLC

(57) ABSTRACT

In an exposure apparatus of a liquid immersion exposure method, there is a case when a wafer table holding a wafer moves, a liquid immersion area formed by liquid supplied in a space between a wafer table and a projection optical system passes over a head mounted on the wafer table. Therefore, for a head over which the liquid immersion area has passed, the residual presence of the liquid is detected based on an amount of light of a reflected light received by the light receiving element which receives the reflected light from the wafer table surface. And, of a plurality of heads, positional information of the wafer table is measured, based on measurement values of a head that had no liquid remaining in the detection.

22 Claims, 8 Drawing Sheets

U.S. PATENT DOCUMENTS

| | | | |
|---|---|---|---|
| 7,025,498 B2 | 4/2006 | Del Puerto | |
| 7,102,729 B2 | 9/2006 | Renkens et al. | |
| 7,161,659 B2 | 1/2007 | Van Den Brink et al. | |
| 7,230,676 B1 | 6/2007 | Loopstra et al. | |
| 7,238,931 B2 | 7/2007 | Nabeshima et al. | |
| 7,253,875 B1 | 8/2007 | Luttikhuis et al. | |
| 7,256,871 B2 | 8/2007 | Loopstra et al. | |
| 7,289,212 B2 | 10/2007 | Kwan | |
| 7,292,312 B2 | 11/2007 | Loopstra et al. | |
| 7,333,174 B2 | 2/2008 | Koenen et al. | |
| 7,348,574 B2 | 3/2008 | Pril et al. | |
| 7,349,069 B2 | 3/2008 | Beems et al. | |
| 7,362,446 B2 | 4/2008 | Van Der Pasch et al. | |
| 7,405,811 B2 | 7/2008 | Beems et al. | |
| 2003/0025890 A1 | 2/2003 | Nishinaga | |
| 2005/0018162 A1* | 1/2005 | Leenders et al. | 355/67 |
| 2005/0128461 A1 | 6/2005 | Beems et al. | |
| 2006/0007419 A1* | 1/2006 | Streefkerk et al. | 355/53 |
| 2006/0103816 A1* | 5/2006 | Belfroid et al. | 355/30 |
| 2006/0103832 A1* | 5/2006 | Hazelton et al. | 355/72 |
| 2006/0139660 A1* | 6/2006 | Patrick Kwan | 356/614 |
| 2006/0227309 A1* | 10/2006 | Loopstra et al. | 355/53 |
| 2006/0257553 A1* | 11/2006 | Ohta et al. | 427/8 |
| 2007/0052976 A1 | 3/2007 | Pril et al. | |
| 2007/0076218 A1 | 4/2007 | Van Empel et al. | |
| 2007/0081135 A1* | 4/2007 | Kamono | 355/53 |
| 2007/0083758 A1 | 4/2007 | Topham et al. | |
| 2007/0109517 A1* | 5/2007 | Takaiwa et al. | 355/53 |
| 2007/0195296 A1 | 8/2007 | Van Der Pasch et al. | |
| 2007/0223007 A1 | 9/2007 | Klaver et al. | |
| 2007/0263191 A1* | 11/2007 | Shibazaki | 355/53 |
| 2007/0263197 A1 | 11/2007 | Luttikhuis et al. | |
| 2007/0288121 A1 | 12/2007 | Shibazaki | |
| 2008/0043212 A1 | 2/2008 | Shibazaki | |
| 2008/0068568 A1 | 3/2008 | Ebihara et al. | |
| 2008/0074681 A1 | 3/2008 | Loopstra et al. | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094604 A1 | 4/2008 | Shibazaki | |
| 2008/0105026 A1 | 5/2008 | Loopstra et al. | |
| 2008/0106722 A1 | 5/2008 | Shibazaki | |
| 2008/0218713 A1 | 9/2008 | Shibazaki | |
| 2008/0240501 A1 | 10/2008 | Van Der Wijst et al. | |
| 2008/0246936 A1 | 10/2008 | Loopstra et al. | |
| 2009/0004580 A1 | 1/2009 | Kanaya | |
| 2009/0053629 A1* | 2/2009 | Shibazaki et al. | 430/30 |
| 2009/0079949 A1 | 3/2009 | Streefkerk et al. | |
| 2009/0190110 A1 | 7/2009 | Shibazaki | |

FOREIGN PATENT DOCUMENTS

| | | | |
|---|---|---|---|
| CN | 101038442 A | | 9/2007 |
| EP | 1 762 897 A1 | | 3/2007 |
| JP | A 6-283403 | | 10/1994 |
| JP | A 2003-28673 | | 1/2003 |
| WO | WO 01/35168 A1 | | 5/2001 |
| WO | WO 2005/074014 A1 | | 8/2005 |
| WO | WO 2007/083758 A1 | | 7/2007 |

OTHER PUBLICATIONS

Nov. 13, 2010 Written Opinion issued in Application No. PCT/JP2009/059232.

\* cited by examiner

EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/071,694 filed May 13, 2008, the disclosure of which is hereby incorporated herein by reference in its entirety.

BACKGROUND OF THE INVENTION

1. Field of the Invention

The present invention relates to exposure apparatus, exposure methods, and device manufacturing methods, and more particularly to an exposure apparatus and an exposure method used in a lithography process to manufacture microdevices such as a semiconductor device, and a device manufacturing method using the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper), or a projection exposure apparatus by a step-and-scan method (a so-called scanning stepper (which is also called a scanner) is mainly used.

However, semiconductor devices will lead to higher integration in the future, and accompanying this, it is certain that the circuit pattern which should be formed on the wafer will be finer, and further improvement of the position detection precision of wafers and the like will be required in the exposure apparatus which is the mass-production apparatus for semiconductor devices.

For example, in U.S. Patent Application Publication No. 2006/0227309, an exposure apparatus is disclosed which employs a liquid immersion exposure method having an encoder type sensor (an encoder head) installed on a substrate table. In this kind of an exposure apparatus, liquid is supplied in a space between a substrate and an optical system so as to form a liquid immersion area, and the liquid immersion area may sometimes move from an area on the substrate to an area on the substrate table by the movement of the substrate table. The liquid may remain on the upper surface (a photodetection surface) of an encoder head, after the encoder head enters into the (liquid forming the) liquid immersion area and then withdraws from the area. In such a case, measurement errors occur in an encoder head that has the liquid remaining on the photodetection surface, or in the case the residual volume is large, measurement itself using the encoder head becomes difficult, and the encoder head will not function normally.

SUMMARY OF THE INVENTION

The present invention was made under the circumstances described above, and according to a first aspect, there is provided an exposure apparatus, the apparatus comprising: a movable body which holds the object and substantially moves along a predetermined plane, a liquid supply device which supplies liquid on a surface of the movable body on which the object is mounted including a surface of the object; a pattern generation device including an optical system which has liquid supplied to a space formed with the surface of the movable body, irradiates an energy beam on the object via the optical system and the liquid, and forms a pattern on the object; a measurement system which includes an encoder system having a plurality of encoder heads placed on the surface of the movable body that measures positional information of the movable body, based on an output of a predetermined number of encoder heads facing a grating section placed parallel to the predetermined plane external to the movable body out of the plurality of encoder heads; and a detection device which is connected to the measurement system, and for at least one of the plurality of encoder heads, detects residual information of the liquid on a photodetection section and outputs the detection results to the measurement system.

According to the apparatus, the detection device detects the residual state of liquid on the photodetection surface for at least one of the plurality of the encoder heads, and the detection results are output to the measurement system. Therefore, of the plurality of encoder heads, the measurement system can measure positional information of the movable body within the predetermined plane using a predetermined number of encoder heads whose residual state of liquid on the photodetection surface is good. Accordingly, it becomes possible to avoid the use of the encoder head which does not function properly due to much liquid remaining on the photodetection surface, which allows a highly accurate and a stable measurement of the positional information of the movable body.

Incidentally, in the case the head is covered with a protective member, such as, for example, a cover glass and the like, of the surface of the cover glass, the term photodetection surface of the head refers to an area of a predetermined range including an area where a measurement beam and a return beam from a grating deriving from the measurement beam pass through. Further, besides a predetermined area region, the detection area of the detection device refers to an area where all of a plurality of detection points take up in the case when the plurality of detection points are arranged at a predetermined distance. In the specification, the terms photodetection surface and detection area are used in such meanings described above.

According to a second aspect of the present invention, there is provided An exposure method in which an energy beam is irradiated on an object via an optical system and liquid, and a pattern is formed on the object, the method comprising: a measurement process in which of a plurality of encoder heads placed on a surface of a movable body where the object is mounted that substantially moves along a predetermined plane, positional information of the movable body is measured, based on an output of a predetermined number of encoder heads facing a grating section placed parallel to the predetermined plane external to the movable body; and a detection process in which residual information of the liquid on the photodetection section is detected for at least one of the plurality of encoder heads.

According to this method, in the detection process, for at least one encoder head of the plurality of encoder heads, the residual state of the liquid on the photodetection surface is detected. Therefore, in the measurement process, of the plurality of encoder heads, positional information of the movable body within the predetermined plane can be measured based on an output of a predetermined number of encoder heads whose residual state of liquid on the photodetection surface is good. Accordingly, the use of the encoder head which does not function properly due to much liquid remaining on the photodetection surface can be avoided, which allows a highly accurate and a stable measurement of the positional information of the movable body.

According to a third aspect of the present invention, there is provided a device manufacturing method, the method including: a process in which a pattern is formed on the object by the exposure method of the present invention; and a process in which the object on which the pattern has been formed is developed.

BRIEF DESCRIPTION OF THE DRAWINGS

In the accompanying drawings;

FIG. 5 is a block diagram showing a partially omitted control system related to stage control of the exposure apparatus in FIG. 1, along with a liquid supply device and the like;

DESCRIPTION OF THE EMBODIMENTS

A First Embodiment

Hereinafter, a first embodiment of the present invention will be described, with reference to FIGS. 1 to 6F.

Figure 1:
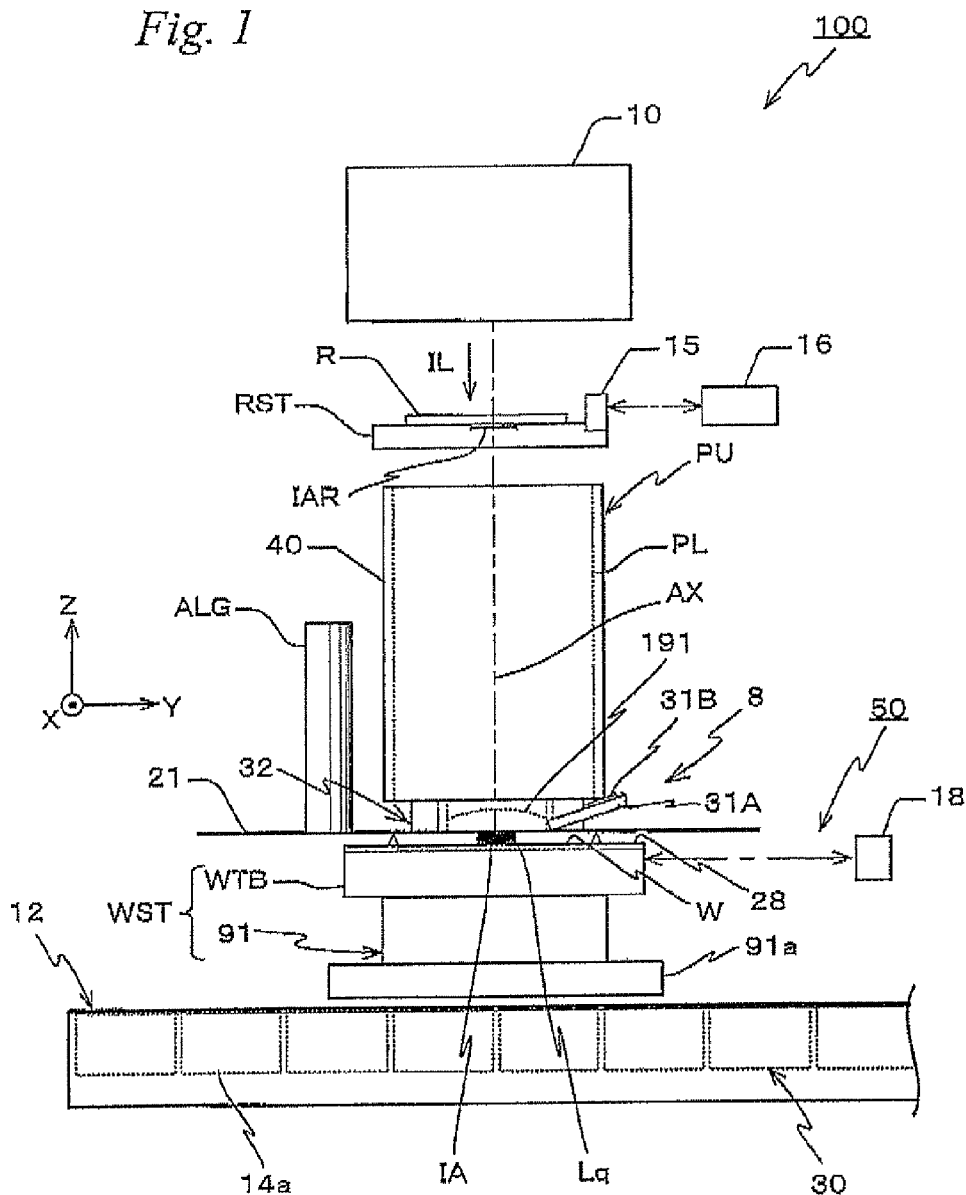
FIG. 1 is a view that schematically shows a configuration of an exposure apparatus related to a first embodiment.

FIG. 1 shows a schematic configuration of an exposure apparatus 100 in the first embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system FL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST holding reticle R, a projection unit PU, a local liquid immersion device 8, a wafer stage device 50 including wafer stage WST on which a wafer W is mounted, a control system for these parts and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR, which is set on reticle R with a reticle blind (a masking system), by an illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 5) that includes a linear motor or the like, and reticle stage RST is also drivable in a scanning direction (in this case, the Y-axis direction, which is the lateral direction of the page surface in FIG. 1) at a predetermined scanning speed.

The positional information (including position information (hereinafter also referred to as θz rotation quantity) in the θz direction) of reticle stage RST in the XY plane (movement plane) is constantly detected, for example, at a resolution of around 0.25 nm by a reticle laser interferometer (hereinafter referred to as a "reticle interferometer") 16, which irradiates a measurement beam on a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) shown in FIG. 1. Incidentally, the encoder system which is disclosed in, for example, U.S. Patent Application Publication No. 2007/0288121 and the like, can be used instead of, or together with reticle interferometer 16 to measure the positional information of reticle R at least in directions of three degrees of freedom.

Projection unit PU is placed below (−Z side) reticle stage RST in FIG. 1, and is held by a mainframe (metrology frame) which configures a part of a body (not shown). Projection unit PU has a barrel 40, and a projection optical system PL consisting of a plurality of optical elements held by barrel 40. As projection optical system PL, for example, a dioptric system is used, consisting of a plurality of lenses (lens elements) that has been disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, illumination light IL that has passed through reticle R which is placed so that its pattern surface substantially coincides with a first plane (an object plane) of projection optical system PL forms a reduced image of the circuit pattern (a reduced image of a part of the circuit pattern) of reticle R formed within illumination area IAR, via projection optical system PL, in an area (exposure area) IA conjugate to illumination area IAR on wafer W whose surface is coated with a resist (a sensitive agent) and is placed on a second plane (an image plane) side of projection optical system PL. And by the synchronous drive of reticle stage RST and wafer stage WST, reticle R relatively moves in the scanning direction (the Y-axis direction) with respect to illumination area IAR (illumination light IL) while wafer W relatively moves in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10 and projection optical system PL, and then by the exposure of the sensitive layer (resist layer) on wafer W with illumination light IL, the pattern is formed on wafer W.

Incidentally, the main frame can be one of a gate type frame which is conventionally used, and a hanging support type frame disclosed in, for example, U.S. Patent Application Publication No. 2008/0068568 and the like.

In exposure apparatus 100 of the embodiment, a local liquid immersion device 8 is installed to perform exposure by a liquid immersion method as is previously described. Local liquid immersion device 8 includes a liquid supply device 5, a liquid recovery device 6 (both of which are not shown in FIG. 1, refer to FIG. 5), a liquid supply pipe 31A, a liquid recovery pipe 31B, a nozzle unit 32 and the like. As shown in FIG. 1, nozzle unit 32 is supported in a suspended state by a mainframe (not shown) holding projection unit PU, so that the periphery of the lower end portion of barrel 40 that holds an optical element closest to the image plane side (the wafer W side) constituting projection optical system PL, in this case, a lens (hereinafter also referred to as a tip lens) 191, is enclosed. In the embodiment, nozzle unit 32 is set so that its lower end surface is on a substantially flush surface with the lower end surface of tip lens 191. Further, nozzle unit 32 is equipped with a supply opening and a recovery opening of a liquid Lq, a lower surface to which wafer W is placed facing and at which the recovery opening is arranged, and a supply flow channel and a recovery flow channel that are connected to a liquid supply pipe 31A and a liquid recovery pipe 31B respectively.

Liquid supply pipe 31A connects to liquid supply device 5 (refer to FIG. 5), and liquid recovery pipe 31B connects to liquid recovery device 6 (refer to FIG. 5), respectively. In this case, in liquid supply device 5, a tank to store the liquid, a compression pump, a temperature controller, a valve for controlling the flow amount of the liquid, and the like are equipped. In liquid recovery device 6, a tank to store the liquid which has been recovered, a suction pump, a valve for controlling the flow amount of the liquid, and the like are equipped.

Main controller 20 controls liquid supply device 5 (refer to FIG. 5), and supplies liquid between tip lens 191 and wafer W (or the upper surface (a plate 28 to be described later) of wafer table WTB on which wafer W is mounted) via liquid supply pipe 31A, and controls liquid recovery device 6 (refer to FIG. 5), and recovers liquid from between tip lens 191 and wafer W via liquid recovery pipe 31B. During the operations, main controller 20 controls liquid supply device 5 and liquid recovery device 6 so that the quantity of liquid supplied constantly equals the quantity of liquid which has been recovered. Accordingly, in the space between tip lens 191 and wafer W, a constant quantity of liquid Lq is held constantly replaced, and by this, a liquid immersion area ALq (for example, refer to FIGS. 2A, 3 and the like) is formed.

In the embodiment, as liquid Lq described above, pure water (hereinafter, it will simply be referred to as "water" besides the case when specifying is necessary) that transmits the ArF excimer laser light (light with a wavelength of 193 nm) is to be used. Incidentally, refractive index n of the water with respect to the ArF excimer laser beam is around 1.44, and in the water the wavelength of illumination light IL is 193 nm×1/n, shortened to around 134 mm.

In the periphery on the −Z side end of barrel 40, for example, a scale plate 21 is placed parallel to the XY plane, at a height substantially flush with a surface on the lower end of barrel 40. In the embodiment, scale plate 21 consists of a rectangular plate which has a circular opening in which the −Z end of barrel 40 is inserted and a circular opening in which the −Z end of an alignment system is inserted formed in a part of the plate, and is supported by suspension by a body (not shown). In the embodiment, scale board 21 is supported by suspension from a main frame (not shown) (metrology frame) which supports projection unit PU. On the lower surface (a surface on the −Z side) of scale plate 21, as a two-dimensional grating, a two-dimensional reflection grating RG (refer to FIG. 4) is formed, which consists of a grating of a predetermined pitch whose periodic direction is in the Y-axis direction, such as, a grating of 1 μm, and a grating of a predetermined pitch whose periodic direction is in the X-axis direction, such as, a grating of 1 μm. This diffraction grating RG is formed in a cross-shaped area of a predetermined width that covers the movement range of wafer stage WST. In the area where diffraction grating RG of scale plate 21 is not formed, an opening section (or a light transmitting section) which becomes the path of the measurement beam of the liquid detecting device which will be described later is formed.

Wafer stage device 50 is equipped with a stage base 12 supported almost horizontally by a plurality of (for example, three or four) vibration isolation mechanisms (omitted in the drawings) on the floor surface, a wafer stage WST placed on stage base 12, a wafer stage drive system 27 (only a part of the system shown in FIG. 1, refer to FIG. 5), and a measurement system which measures positional information of wafer stage WST. The measurement system is equipped with an encoder system 70, a wafer laser interferometer system 18 and the like shown in FIG. 5. Incidentally, encoder system 70 and wafer laser interferometer system 18 will be further described later in the description.

Stage base 12 is made of a member having a tabular form, and the degree of flatness of the upper surface is extremely high and serves as a guide surface when wafer stage WST moves. Inside stage base 12, a coil unit is housed, including a plurality of coils 14a placed in the shape of a matrix with the XY two-dimensional direction serving as a row direction and a column direction.

As shown in FIG. 1, wafer stage WST has a stage main section 91, and a wafer table WTB which is placed above stage main section 91 and is supported in a non-contact manner with respect to stage main section 91 by a Z tilt drive mechanism (not shown). In this case, wafer table WTB is supported in a non-contact manner by Z tilt drive mechanist by adjusting the balance of the upward force (repulsion) such as the electromagnetic force and the downward force (gravitation) including the self-weight at three points, and is also finely driven in directions of three degrees of freedom, which are the Z-axis direction, the θx direction, and the θy direction. At the bottom of stage main section 91, a slider section 91a is arranged. Slider section 91a has a magnetic unit made up of a plurality of magnets arranged two-dimensionally within the XY plane, a housing to house the magnetic unit, and a plurality of air bearings arranged in the periphery of the bottom surface of the housing. The magnet unit configures a planar motor 30 which uses the drive of a Lorentz electromagnetic force as disclosed in, for example, U.S. Pat. No. 5,196,745, along with the coil unit previously described. Incidentally, as planar motor 30, the drive method is not limited to the method using the Lorentz force electromagnetic force, and a planar motor by a variable reluctance drive system can also be used.

Wafer stage WST is supported by levitation above stage base 12 by a predetermined clearance, such as around several μm, by the plurality of air bearings described above, and is driven in the X-axis direction, the Y-axis direction, and the θz direction by planar motor 30. Accordingly, wafer table WTB (wafer W) is drivable with respect to stage base 12 in directions of six degrees of freedom. Incidentally, wafer stage WST can be driven in directions of six degrees of freedom by planar motor 30.

In the embodiment, a main controller 20 controls the magnitude and direction of current supplied each of the coils 14a configuring the coil unit. Wafer stage drive system 27 is configured, including planar motor 30 and the Z tilt drive mechanism previously described. Incidentally, planar motor 30 is not limited to a motor using a moving magnet method, and can be a motor using a moving coil method. Or, as planar motor 30, a magnetic levitation type planar motor can be used. In this case, the air bearing previously described does not have to be arranged. Further, wafer table WTB can be finely movable in at least one of the X-axis direction, the Y-axis direction, and the Z-axis direction. More specifically, wafer stage WST can be configured by a rough/fine movement stage.

Figure 3:
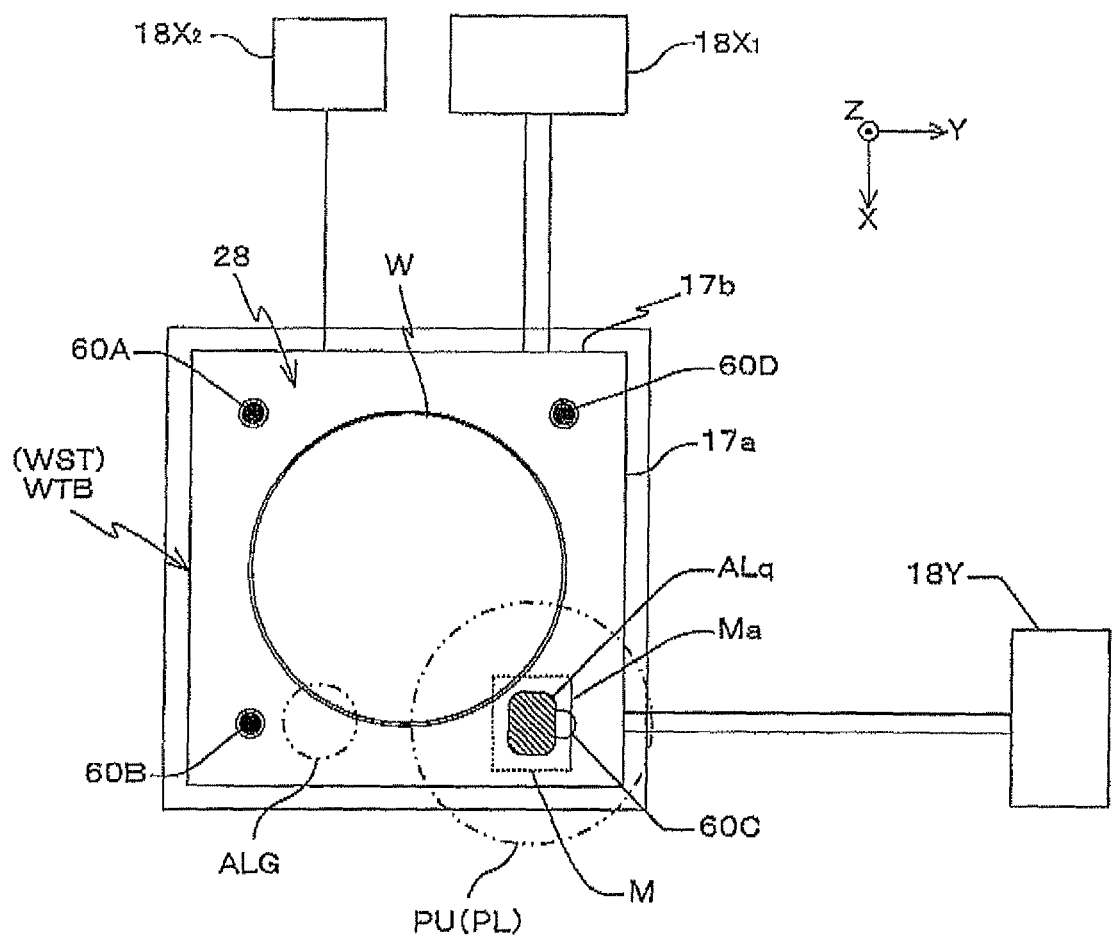
FIG. 3 is a view to explain a placement of an encoder head and an interferometer.

On wafer table WTB, wafer W is mounted via a wafer holder (not shown), and is fixed by a chuck mechanism (not shown), such as, for example, vacuum suction (or electrostatic adsorption). On a surface on the +Y side (the +Y edge surface) and a surface on the −X side (the −X edge surface) of wafer table WTB, respectively, mirror-polishing is applied, and reflection surfaces 17a and 17b which are used in wafer laser interferometer system 18 to be described later are formed as shown in FIG. 3. On the outer side of the wafer holder (mounting area of the wafer), as shown in FIG. 3, a plate (a liquid repellent plate) 28 is arranged that has a circular opening slightly larger than the wafer holder formed in the center, and also has a rectangular outer shape (contour). Plate 28 is made of a transparent material with low thermal expansion, such as for example, glass. A liquid repellent treatment against liquid Lq is applied to the surface of plate 28 (a liquid repellent surface is formed). Incidentally, plate 28 is installed so that its entire surface or a part of its surface becomes flush with the surface of wafer W.

Encoder system 70 measures positional information (including information on the θz rotation quantity) of wafer stage WST in the XY plane. Now, a configuration and the like of encoder system 70 will be described in detail.

Figure 4:
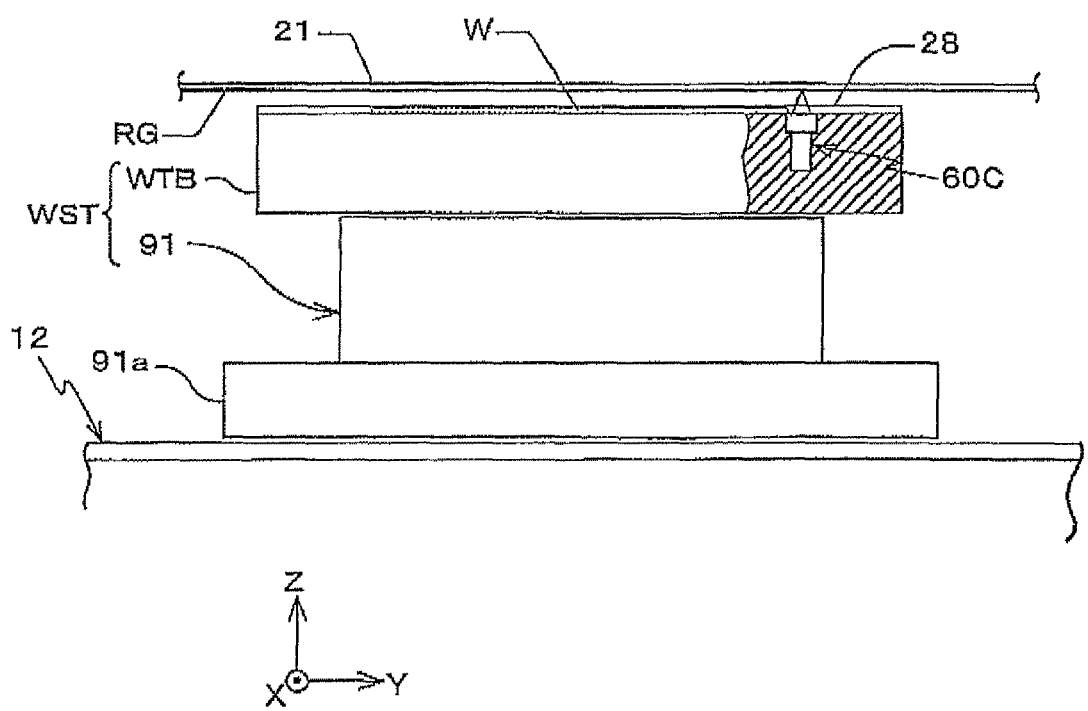
FIG. 4 is an enlarged view where a part of the wafer stage in FIG. 1 is fractured.

On wafer table WTB, as shown in a planar view in FIG. 3, an encoder head (hereinafter, shortly referred to as a head, as needed) 60A, 60B, 60C, and 60D are placed in the four corners, respectively. Heads 60A to 60D are placed at positions so that the separation distance between heads adjacent in the X-axis direction or the Y-axis direction is sufficiently greater than the width of liquid immersion area ALq. These heads 60A to 60D are fitted inside holes of a predetermined depth in the Z-axis direction which have been formed in wafer table WTB, respectively, as shown in FIG. 4 with head 60C taken up as a representative. The upper surfaces of heads 60A to 60D are covered by plate 28.

Referring back to FIG. 3, a pair of heads 60A and 60C, which is located on one of the diagonal lines on the upper surface of wafer table WTB, are heads (Y heads) whose measurement direction is in the Y-axis direction. Further, a pair of heads 60B and 60D, which is located on the other diagonal line on the upper surface of wafer table WTB, are heads (X heads) whose measurement direction is in the X-axis direction. As each of the heads 60A to 60D, heads having a configuration similar to the head disclosed in, for example, U.S. Pat. No. 7,238,931, International Publication No. 2007/083758 and the like are used. In heads with such a configuration, since the optical path lengths of the two beams are extremely short, the influence of air fluctuation can mostly be ignored. However, in the embodiment, the light source and a photodetector are arranged external to each head, or more specifically, inside (or outside) stage main section 91, and only the optical system is arranged inside of each head. And the light source, the photodetector, and the optical system are optically connected via an optical fiber (not shown). In order to improve the positioning precision of wafer table WTB (fine movement stage), air transmission of a laser beam and the like can be performed between stage main section 91 (rough movement stage) and wafer table WTB (fine movement stage) (hereinafter shortly referred to as a rough/fine movement stage), or a configuration can be employed where a head is provided in stage main section 91 (rough movement stage) so as to measure a position of stage main section 91 (rough movement stage) using the head and to measure relative displacement of the rough/fine movement stage with another sensor.

Y heads 60A and 60C configure Y linear encoders (hereinafter appropriately shortened to "Y encoders" or "encoders") 70A and 70C (refer to FIG. 5), respectively, which measure the position of wafer stage WST in the Y-axis direction by irradiating measurement beams (measurement lights) on scale plate 21 and receiving diffraction beams from the grating whose periodic direction is the Y-axis direction formed on the surface (lower surface) of scale plate 21. Further, X heads 60B and 60D configure X linear encoders (hereinafter appropriately shortened to "encoders") 70B and 70D (refer to FIG. 5), respectively, which measure the position of wafer stage WST in the X-axis direction by irradiating measurement beams on scale plate 21 and receiving diffraction beams from the grating whose periodic direction is the X-axis direction formed on the surface of scale plate 21.

Figure 5:
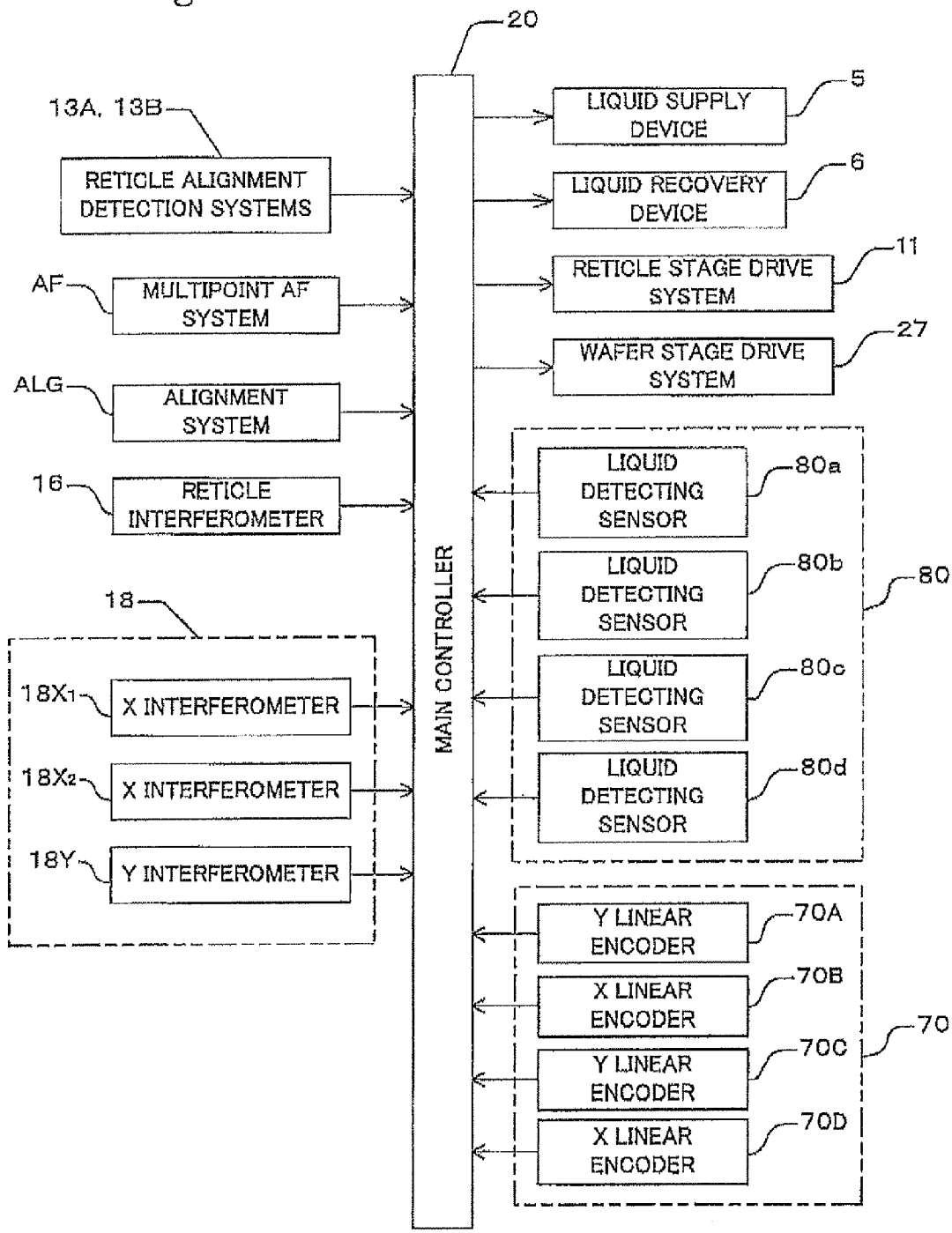

The measurement values of each of the encoders 70A to 70D are supplied to main controller 20 (refer to FIG. 5). Main controller 20 obtains positional information (including information on the θz rotation quantity) of wafer table WTB (wafer stage WST) in the XY plane, based on measurement values (output) of at least three encoders (more specifically, at least three encoders which output effective measurement values) facing the lower surface of scale plate 21 on which diffraction grating RG is formed.

Liquid detecting device 80 (refer to FIG. 5) is installed around nozzle unit 32. Liquid detecting device 80 is used to detect the residual state of liquid Lq on the upper surface (the upper surface of plate 28) of wafer table WTB, or in the embodiment, whether there is any residual liquid or not. Liquid detecting device 80 is mainly used to detect a residual state of liquid Lq on the photodetection surface (an area of a predetermined range on the upper surface of plate 28 including the area through which the measurement beams from each encoder head and diffraction beams from diffraction grating RG deriving from the measurement beam pass) of encoder heads 60A to 60D.

Liquid detecting device 80 includes four liquid detecting sensors 80a, 80b, 80c, and 80d (refer to FIG. 5) which have a configuration similar to a multiple point focal point position detection system of an oblique incidence method disclosed in, for example, Kokai (Japanese Patent Unexamined Application Publication) No. 6-283403 (corresponding U.S. Pat. No. 5,448,332) and the like consisting of an irradiation system and a photodetection system. In the multiple point focal point position detection system, a Z position is detected using a change in light quantity of a reflected light from each detection point on the wafer surface to a light receiving element via a slit that occurs when a position of the wafer surface in the Z-axis direction (a Z position) shifts from the best focus position. On the other hand, in liquid detecting sensors 80a to 80d of the embodiment, the residual state of liquid Lq is detected using a change in light quantity of a reflected light from each detection point on the upper surface of wafer table WTB to a light receiving element via a slit of the reflected light by the influence of liquid Lq remaining on the upper surface of wafer table WTB.

Figure 2A:
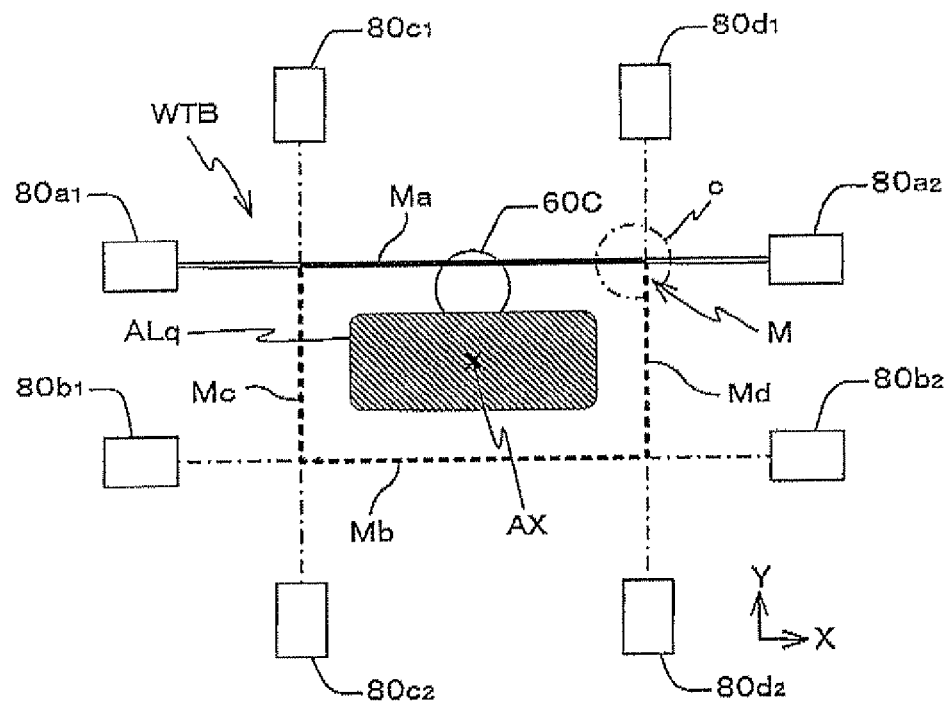
FIG. 2A is a view used to explain a configuration of the liquid detecting device.
Figure 2B:
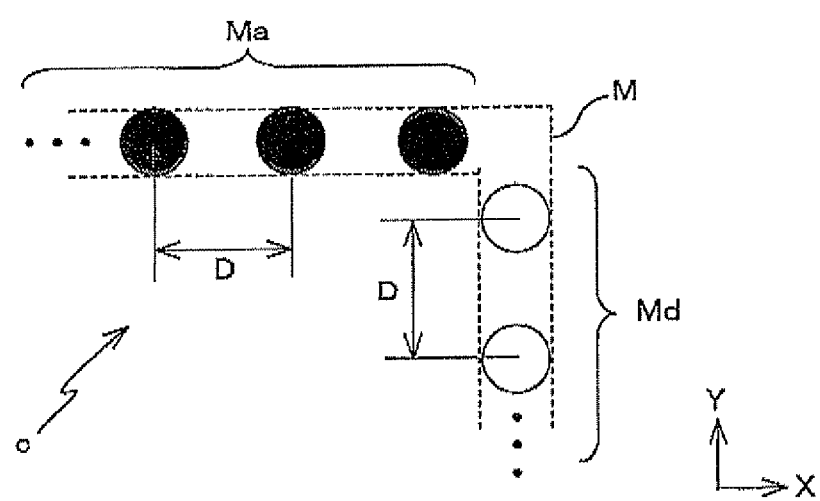
FIG. 2B is a view used to explain a placement of detection points.

As shown in FIG. 2A, liquid detecting sensor 80a has an irradiation system 80a$_1$ and a photodetection system 80a$_2$ which are placed opposing each other at a position symmetric with respect to a reference axis (not shown) in the Y-axis direction which passes through optical axis AX of projection optical system PL, on the +Y side of liquid immersion area ALq. Liquid detecting sensor 80a has a plurality of detection points Ma arranged along the X-axis direction at a predetermined distance on the +Y side of liquid immersion area ALq (refer to FIG. 2B which shows an enlarged view of a circle c in FIG. 2A). However, in FIG. 2A, the plurality of detection points on which each of the detection beams are irradiated is not illustrated individually, and is shown as a long and narrow detection area Ma extending in the X-axis direction between irradiation system $80a_1$ and photodetection system $80a_2$.

Further, as shown in FIG. 2A, liquid detecting sensor 80b has an irradiation system $80b_1$ and a photodetection system $80b_2$ which are symmetrically placed to irradiation system $80a_1$ and a photodetection system $80a_2$, respectively, with respect to a reference axis (not shown) in the X-axis direction which passes through optical axis AX of projection optical system PL. Liquid detecting sensor 80b has a plurality of detection points Mb arranged along the X-axis direction at a predetermined distance on the −Y side of liquid immersion area ALq.

As shown in FIG. 2A, liquid detecting sensor 80d has an irradiation system $80d_1$ and a photodetection system $80d_2$ which are placed opposing each other at a position symmetric with respect to a reference axis (not shown) in the X-axis direction which passes through optical axis AX of projection optical system PL, on the +X side of liquid immersion area ALq. Liquid detecting sensor 80d has a plurality of detection points Md arranged along the Y-axis direction at a predetermined distance D on the −X side of liquid immersion area ALq (refer to FIG. 2B).

Further, as shown in FIG. 2A, liquid detecting sensor 80c has an irradiation system $80c_1$ and a photodetection system $80c_2$ which are symmetrically placed to irradiation system $80d_1$ and a photodetection system $80d_2$, respectively, with respect to a reference axis (not shown) in the Y-axis direction which passes through optical axis AX of projection optical system PL. Liquid detecting sensor 80c has a plurality of detection points Mc arranged along the Y-axis direction at a predetermined distance on the −X side of liquid immersion area ALq.

All detection points Ma to Md (collectively referred to as M) that liquid detecting sensors 80a to 80d have surround liquid immersion area ALq, as shown in FIG. 2A.

Incidentally, the irradiation systems and the photodetection systems of liquid detecting sensors 80a to 80d are supported by suspension from a mainframe (not shown) which holds projection unit PU, along with nozzle unit 32. In this case, the irradiation system and the photodetection system which make a pair with each other are placed at positions where irradiation of the measurement light and receiving the reflected light from the surface of plate 28 are possible, via the opening section (or light transmitting section) of scale plate 21.

Irradiation system $80a_1$ configuring liquid detecting sensor 80a irradiates measurement beams which are obliquely incident on points on wafer table WTB which are positioned at each of the detection points Ma. Photodetection system $80a_2$ receives the reflected lights of these measurement beams from wafer table WTB, and outputs the detection results (signals that show light quantity of the reflected light from each detection point) to main controller 20. The other liquid detecting sensors 80b, 80c, and 80d also function in a similar manner as liquid detecting sensor 80a.

Liquid detecting sensors 80a to 80d irradiate measurement beams of a constant quantity which are obliquely incident toward the upper surface of wafer table WTB in the manner described above. In this case, if the liquid does not remain on wafer table WTB, reflected lights of a constant quantity are constantly detected at each detection point by each light receiving element of the respective photodetection systems. However, when the liquid remains on wafer table WTB, light quantity of the reflected light detected by each of the light receiving elements decreases because a part of the measurement beams is interrupted, or is reflected diffusely by the liquid. By detecting such a change in light quantity, liquid detecting sensors 80a to 80d detect the residual state of the liquid on the upper surface of wafer table WTB corresponding to the photodetection surface of encoder heads 60A to 60D. The usage of liquid detecting sensors 80a to 80d (liquid detecting device 80) will be described in detail later on.

In exposure apparatus 100 of the embodiment, wafer laser interferometer system (hereinafter referred to as "wafer interferometer system") 18 (refer to FIG. 5) can measure the position of wafer stage WST, independently from encoder system 70.

As shown in FIG. 3, wafer interferometer system 18 is equipped with a Y interferometer 18Y which irradiates a plurality of measurement beams in the Y-axis direction on reflection surface 17a of wafer table WTB, and an X interferometer which irradiates one or more than one measurement beams parallel to the X-axis direction on reflection surface 17b, and this X interferometer includes a plurality of, in the embodiment, two X interferometers $18X_1$ and $18X_2$.

The substantial measurement axis in the Y-axis direction of Y interferometer 18Y is a straight line (the reference axis previously described) in the Y-axis direction which passes through optical axis AX of projection optical system PL and the detection center of alignment system ALG which will be described later on. Y interferometer 18Y measures the positional information of wafer table WTB in the Y-axis direction and the θz direction (and the θx direction).

Further, the substantial measurement axis in the X-axis direction of X interferometer $18X_1$ is a straight line (the reference axis previously described) in the X-axis direction which passes through optical axis AX of projection optical system PL. X interferometer $18X_1$ measures the positional information of wafer table WTB in the X-axis direction and the θz direction (and the θy direction).

Further, the measurement axis of X interferometer $18X_2$ is a straight line in the X-axis direction which passes through the detection center of alignment system ALG. X interferometer $18X_1$ measures the positional information of wafer table WTB in the X-axis direction (and the θy direction).

Incidentally, instead of reflection surfaces 17a and 17b, for example, a movable mirror consisting of a plane mirror can be attached to the end of wafer table WTB. Further, a reflection surface inclined at an angle of 45 degrees to the XY plane can be arranged on wafer table WTB, and the position of wafer table WTB in the Z-axis direction can be measured via the reflection surface.

The measurement values of each of the interferometers of interferometer system 18 are supplied to main controller 20. In the embodiment, however, positional information (including information on the θz rotation quantity) for position control of wafer stage WST (wafer table WTB) within the XY plane is mainly measured by encoder system 70 previously described, and the measurement values of interferometers 18Y, $18X_1$, and $18X_2$ are secondarily used in cases such as when long-term fluctuation (for example, by temporal deformation or the like of the scales) of the measurement values of encoder system 70 is corrected (calibrated), or as backup at the time of output abnormality in the encoder system. Further, in the embodiment, main controller 20 computes the positional information of wafer stage WST (wafer table WTB) within the XY plane based on measurement values of each of the interferometers of wafer interferometer system 18 at a predetermined sampling interval (an interval which is much shorter than a generation timing of a control clock for controlling the position of wafer stage WST) when controlling the position of wafer stage WST (wafer table WTB) within the XY plane by encoder system 70, and based on the computation results, monitors whether or not any one of the four heads 60A to 60D is close to liquid immersion area ALq (or is located within liquid immersion area ALq). More specifically, in the embodiment, the measurement values of each of the interferometers of wafer interferometer system 18 are used not only secondarily for the purpose previously described, but also for monitoring the positional relation between heads 60A to 60D and liquid immersion area ALq.

Alignment system ALG is an alignment system of an off-axis method placed on the −Y side of projection optical system PL away by a predetermined distance, as shown in FIGS. 1 and 3. In the embodiment, as alignment system ALG, as an example, an FIA (Field Image Alignment) system is used which is a type of an alignment sensor by an image processing method that measures a mark position by illuminating a mark using a broadband (a wide band wavelength range) light such as a halogen lamp and performing image processing of the mark image. The imaging signals from alignment system ALG are supplied to main controller 20 (refer to FIG. 5), via an alignment signal processing system (not shown).

Incidentally, alignment system ALG is not limited to the FIA system, and an alignment sensor, which irradiates a coherent detection light to a subject mark and detects a scattered light or a diffracted light generated from the subject mark or makes two diffracted lights (for example, diffracted lights of the same order or diffracted lights being diffracted in the same direction) generated from the subject mark interfere and detects an interference light, can naturally be used alone or in combination as needed. As alignment system ALG, an alignment system having a plurality of detection areas like the one disclosed in, for example, U.S. Patent Application Publication No. 2008/0088843 can be employed.

Moreover, in exposure apparatus 100 of the embodiment, a multiple point focal point position detection system (hereinafter shortly referred to as a multipoint AF system) AF (not shown in FIG. 1, refer to FIG. 5) by the oblique incidence method having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 5) via an AF signal processing system (not shown). Main controller 20 detects positional information of the wafer W surface in the Z-axis direction at each detection point based on the detection signals of multipoint AF system AF, and performs a so-called focus leveling control of wafer W during the scanning exposure based on the detection results. Incidentally, multipoint AF system can be arranged in the vicinity of alignment system ALG and surface position information (unevenness information) of the wafer surface can be obtained beforehand at the time of wafer alignment, and at the time of exposure, the surface position information and measurement values of a different sensor (for example, an encoder, an interferometer and the like) detecting a position of the wafer table upper surface in the Z-axis direction can be used to perform the so-called focus leveling control of wafer W.

In exposure apparatus 100, furthermore, above reticle R, a pair of reticle alignment detection systems 13A and 13B (not shown in FIG. 1, refer to FIG. 5) of a TTR (Through The Reticle) method which uses light of the exposure wavelength is arranged. Detection signals of reticle alignment detection systems 13A and 13B are supplied to main controller 20 via an alignment signal processing system (not shown).

FIG. 5 is a block diagram showing a partially omitted control system related to stage control in exposure apparatus 100, along with a liquid supply device and a liquid recovery device. This control system is mainly configured of main controller 20. Main controller 20 includes a so-called microcomputer (or workstation) consisting of a CPU (Central Processing Unit), ROM (Read Only Memory), RAM (Random Access Memory) and the like, and has overall control over the entire apparatus.

In exposure apparatus 100 configured in the manner described above, on manufacturing devices, reticle alignment and baseline measurement of alignment system ALG are performed, in a procedure similar to an typical scanning stepper (a procedure disclosed in, for example, U.S. Pat. No. 5,646,413 and the like) using reticle alignment detection systems 13A and 13B, a fiducial plate (not shown) on wafer table WTB and the like previously described, and around this time, wafer alignment (Enhanced Global Alignment (EGA) which is disclosed in, for example, U.S. Pat. No. 4,780,617 and the like) and the like are performed.

Then, main controller 20 performs an exposure operation by the step-and-scan method, based on the measurement results of the baseline and the results of the wafer alignment, and a pattern of reticle R is transferred onto each of a plurality of shot areas on wafer W. The exposure operation by the step-and-scan method is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area. Further, in exposure apparatus 100 of the embodiment, on the scanning exposure described above, illumination light IL outgoing from reticle R is projected on a sensitive layer (a resist layer) on wafer W, via liquid Lq supplied in the space between wafer W and tip lens 191 of projection optical system PL. More specifically, liquid immersion exposure is performed. This allows a pattern of reticle R to be transferred in each shot area on wafer W.

When a pattern is transferred on a shot area in the periphery edge of wafer W during the exposure operation by the step-and-scan method described above, liquid immersion area ALq (or a part of the area) formed on wafer W by liquid Lq may move from an area above wafer W to an area above plate 28 of wafer table WTB by the movement of wafer stage WST, and may furthermore move to the area of heads 60A to 60D on plate 28. In other words, heads 60A to 60D may enter into liquid immersion area ALq. FIG. 3 shows a state where liquid immersion area ALq has reached a part of head 60C.

In a state where liquid immersion area ALq has moved right above a head (for example, head 60C), a phenomenon such as a measurement beam from head 60C being interrupted, scattered, or the wavelength shortened by liquid Lq forming liquid immersion area ALq and the like may occur. Accordingly, head 60C will not function normally. In this case, if in the case head 60C was included in one of the three heads used for position control of wafer stage WST in the XY plane, the position of wafer stage WST in the XY plane cannot be controlled properly.

In the embodiment, in order to avoid such a situation from occurring, as previously described, main controller 20 computes the positional information of wafer stage WST (wafer table WTB) within the XY plane based on measurement values of each of the interferometers of wafer interferometer system 18 at a predetermined sampling interval when controlling the position of wafer stage WST (wafer table WTB) within the XY plane by encoder system 70, and based on the computation results, judges whether or not any one of the four heads 60A to 60D has approached liquid immersion area ALq. And when main controller 20 judges that either one of the heads (for example, head 60C) has approached the liquid immersion area, main controller 20 performs position control of wafer stage WST in the XY plane based on the measurement values of the heads (for example, 60A, 60B, and 60D) (the encoders configured by the heads (for example, 70A, 70B, and 70C)) besides the head (for example, head 60C).

In this case, the state of FIG. 3 actually shows a state where wafer stage WST proceeds in the +Y direction from a position where head 60C was located on the −Y side of liquid immersion area ALq, and along with this movement, head 60C is about to exit after entering inside liquid immersion area ALq, or in other words, a state just before liquid immersion area ALq finishes passing through the area over head 60C. In this case, when wafer stage WST moves in the +Y direction from the position shown in FIG. 3, liquid immersion area ALq passes through the area above head 60C and head 60C moves away from liquid immersion area ALq, and in a normal situation, head 60C comes to function properly (restores its function) and head 60C can be used in position control of wafer stage WST.

However, supposing that when some of liquid Lq remains on (the upper surface of wafer table WTB (the upper surface of plate 28) corresponding to) the photodetection surface of head 60C after liquid immersion area ALq has passed through the area above head 60C, a phenomenon such as a measurement beam of head 60C being interrupted, scattered, or the wavelength shortened by the remaining liquid Lq may occur, which may keep head 60C from functioning properly.

Therefore, after liquid immersion area ALq has passed through the area above any of heads 60A to 60C, main controller 20 detects the residual state of the liquid on the upper surface of plate 28 corresponding to the photodetection surface of the head, using liquid detecting device 80 (liquid detecting sensors 80a to 80d) previously described.

An example of the detection of the residual state of the liquid will now be described, referring to FIGS. 6A to 6F.

Figure 6A:
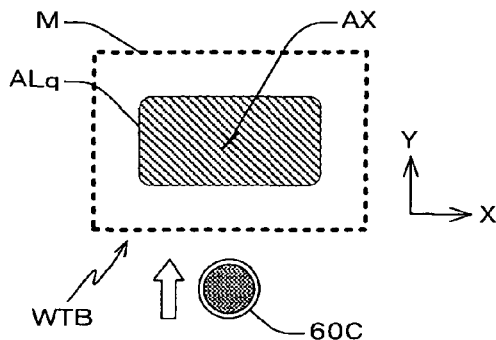
FIGS. 6A to 6F are views used to explain a diagnostic procedure of residual liquid using the liquid detecting device.

FIG. 6A shows a state before head 60C enters into liquid immersion area ALq, along with the movement of wafer table WTB (wafer stage WST). In this state, main controller 20 is to measure positional information of wafer table WTB (wafer stage WST) using three heads (for example, heads 60A, 60C, and 60D) including head 60C for position control of wafer table WTB (wafer stage WST). In FIGS. 6A to 6F, the same head 60C is illustrated as a colored circle (a double-lined circle) and a colorless circle (an outlined circle). The colored circle here indicates a state where head 60C is used to measure the positional information of wafer table WTB, and the colorless circle indicates a state where head 60C is not used to measure the positional information of wafer table WTB.

In the embodiment, as is previously described, main controller 20 monitors the positional relation between heads 60A to 60D and liquid immersion area ALq, using positional information of wafer table WTB (wafer stage WST) which is constantly measured using wafer interferometer system 18. And, main controller 20 is aware when any one of the heads comes within a predetermined distance of liquid immersion area ALq. For example, in the state shown in FIG. 6A, main controller 20 is aware that head 60C has approached liquid immersion area ALq, and before head 60C enters into liquid immersion area ALq, changes the head used to measure the positional information of wafer table WTB from head 60C to a head which has not been used yet (for example, 60B). After this change, main controller 20 controls the position of wafer table WTB based on measurement values of heads 60A, 60B, and 60D. Incidentally, in the embodiment, while the positional relation between heads 60A to 60D and liquid immersion area ALq is monitored using the positional information of wafer table WTB (wafer stage WST) measured using wafer interferometer system 18, as well as this, the positional relation between heads 60A to 60D and liquid immersion area ALq can also be monitored using the positional information of wafer table WTB (wafer stage WST) measured using encoder system 70, as long as an unmeasurable state of positional information (X, Y, θz) of wafer table WTB (wafer stage WST) within the XY plane can be prevented, such as in a case when the switching of the heads can be performed within a short time.

Figure 6B:
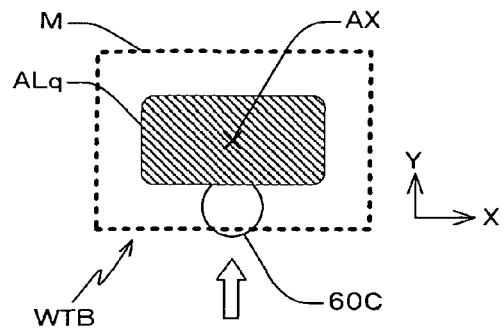
Figure 6C:
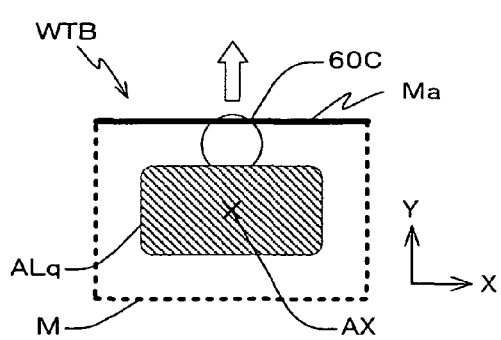

When wafer table WTB moves in the +Y direction from a state shown in FIG. 6A, head 60C enters liquid immersion area ALq accompanying the movement. FIG. 6B shows a state immediately after the head begins to enter the liquid immersion area. Then, when wafer table WTB moves further in the +Y direction from the state shown in FIG. 6B, head 60C moves out of liquid immersion area ALq as shown in FIG. 6C, and passes some of a plurality of detection points Ma of liquid detecting sensor 80a configuring liquid detecting device 80. FIG. 6C shows a state immediately after head 60C begins to pass such detection points Ma.

Figure 6D:
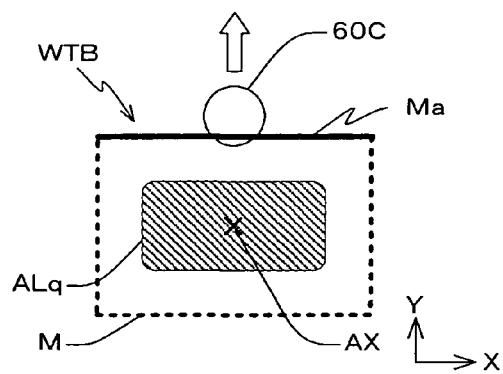

In this case, main controller 20 begins the detection of the residual state (in this case, residue presence) of liquid Lq on the photodetection surface of head 60C, using liquid detecting sensor 80a which liquid detecting device 80 has. More specifically, measurement beams from irradiation system 80a1 of liquid detecting sensor 80a are irradiated on a plurality of detection points Ma on the upper surface of wafer table WTB (the upper surface of plate 28). In this case, because a part of detection points Ma are located on head 60C, a part of the measurement beams are irradiated on the upper part of head 60C. And, along with the movement of wafer table WTB, head 60C finishes passing through detection points Ma. FIG. 6D shows a state just before head 60C finishes passing through.

Figure 6E:
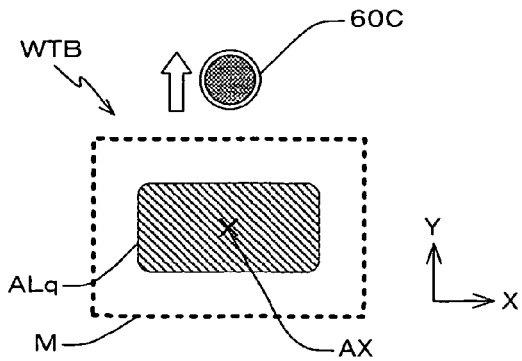

While a state shown in FIG. 6C changes to a state shown in FIG. 6D along with the movement of wafer stage WST in the +Y direction and head 60C passes through detection points Ma, main controller 20 monitors the light quantity of reflected lights detected by a plurality of light receiving elements (each light receiving element individually corresponding to detection points Ma) of photodetection system 80a$_2$. If the light quantity (an integrated value or a time average value of a predetermined time including the head passing through the liquid immersion area) of the reflected lights respectively detected at the plurality of light receiving elements of photodetection system 80a$_2$ is approximately the same at all the light receiving elements, then main controller 20 detects that there is no liquid Lq remaining on the photodetection surface of head 60C. In this case, as shown in FIG. 6E, main controller 20 can start to use head 60C again instead of any one of the other heads, in order to measure the positional information of wafer table WTB.

Figure 6F:
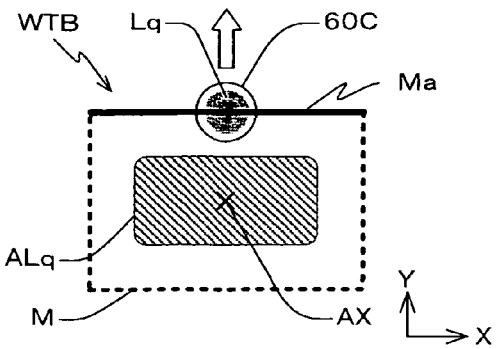

Meanwhile, when liquid Lq remains in the area on the upper surface of wafer table WTB (the upper surface of plate 28) corresponding to the photodetection surface of head 60C after head 60C passes through liquid immersion area ALq as shown in FIG. 6F, because the measurement beams of liquid detecting sensor 80a are interrupted or scattered by liquid Lq, of the plurality of light receiving elements of photodetection system $80a_2$, light quantity of the reflected lights detected by some of the light receiving elements corresponding to a part of detection points Ma where head 60c (an area on the upper surface (the upper surface of plate 28) of wafer table WTB corresponding to the photodetection surface) passes through, decreases more than the light quantity of the reflected lights detected by other light receiving elements. Therefore, main controller 20 detects that liquid Lq remains on the photodetection surface of head 60C in the case when light quantity of the reflected lights detected by some of the light receiving elements described above decreases more than the light quantity of the reflected lights detected by other light receiving elements, while a state shown in FIG. 6C changes into a state shown in FIG. 6D along with the movement of wafer stage WST in the +Y direction and head 60C passes some detection points Ma. In this case, main controller 20 continues to use the three remaining heads except for head 60C to measure the positional information of wafer table WTB.

As described, once the head has been detected to have liquid Lq remaining on its photodetection surface, main controller 20 does not use the head to measure the positional information of wafer stage WST until the head passes through liquid immersion area ALq again and it has been detected using liquid detecting device 80 (liquid detecting sensors 80a to 80d) that liquid Lq no longer remains. Accordingly, in exposure apparatus 100 of the embodiment where four heads are installed on wafer table WTB, in the case when two or more heads are detected to have liquid Lq remaining, or in the case when residual liquid has been detected in one head, and then residual liquid is detected in another head before the one head is detected to confirm that there is no residual liquid Lq, measurement of positional information (including information on the θz rotation quantity) of wafer stage WST within the XY plane using encoder system 70 is no longer possible. Therefore, five or more heads can be installed on wafer table WTB so that such a situation is less likely to occur.

As in the case of head 60C described above, when any of the heads withdraw to the +Y side from liquid immersion area ALq, main controller 20 detects whether there is any residual liquid or not, using liquid detecting sensor 80a which has a plurality of detection points (detection areas) Ma on the +Y side of liquid immersion area ALq. Further, when any of the heads withdraws from liquid immersion area ALq to the −Y side, the −X side, or the +X side of the liquid immersion area, main controller 20 detects whether there is any residual liquid or not, respectively using liquid detecting sensors 80b, 80c, and 80d having a plurality of detection points Mb, Mc, and Md on the −Y side, the −X side, and the +X side of liquid immersion area ALq, similar to the case when using sensor 80a.

As described in detail above, according to exposure apparatus 100 of the embodiment, main controller 20 monitors the positional relation between heads 60A to 60D and liquid immersion area ALq, based on the measurement values of wafer interferometer system 18 (or encoder system 70), and when any of the heads is recognized passing through liquid immersion area ALq, one sensor of liquid detecting sensors 80a to 80d of liquid detecting device 80 is selected according to the proceeding direction of wafer stage WST at the time, and by the liquid detecting sensor which has been selected, the residual state of liquid Lq on the photodetection surface is detected for one head (the head whose upper surface liquid immersion area ALq passes) of heads 60A to 60D and the detection results output to main controller 20. Therefore, main controller 20 can measure the positional information of wafer stage WST within the XY plane, using three heads whose liquid residual state on the photodetection surface is good (more specifically, no liquid remaining) of head 60A to 60D. Accordingly, the use of the encoder head which does not function properly due to much liquid remaining on the photodetection surface can be avoided, which allows a highly accurate and a stable measurement of the positional information of wafer stage WST.

Further, according to exposure apparatus 100 of the embodiment, because main controller 20 performs position measurement and position control of wafer stage WST with high precision, using the three encoder heads that do not have any liquid remaining on the photodetection surface also during the exposure operation by the step-and-scan method, it becomes possible to transfer a pattern of reticle R on each shot area on wafer W with good precision by the liquid immersion exposure by the scanning exposure method.

Further, in exposure apparatus 100 of the embodiment, it is also effective to provide a sequence to detect the residual state of the liquid for all the heads appropriately, at times such as during an idle state of the apparatus, at the time of wafer exchange and the like. Therefore, a sensor similar to (the individual liquid detecting sensors 80a to 80d that configure) liquid detecting device 80 can be arranged at a suitable place other than the vicinity of liquid immersion area ALq, such as for example, in the vicinity of a position where all the heads pass before the beginning of exposure.

Incidentally, in the embodiment above, detection points M of (the four liquid detecting sensors 80a to 80d) of liquid detecting device 80 were placed so as to surround the periphery of liquid immersion area ALq. However, as well as this, because liquid immersion area ALq is wide in the X-axis direction, there also may be a case where the head hardly passes liquid immersion area ALq in the X-axis direction, and in such a case, the detection points (detection areas) of the liquid detecting device can be placed on only the ±Y sides of liquid immersion area ALq. More specifically, the sensors arranged may only be liquid detecting sensors 80a and 80b, which have detection points Ma and Mb.

Incidentally, in the embodiment above, the case has been described where liquid detecting sensors 80a to 80d that configure liquid detecting device 80 are placed external to wafer stage WST, and the residual state of the liquid is detected for the head which has passed through liquid immersion area ALq. However, as well as this, a liquid detecting sensor which configures a part of the liquid detecting device can be individually arranged at the plurality of heads mounted on wafer stage WST, such as for example, heads 60A to 60D.

Figure 7A:
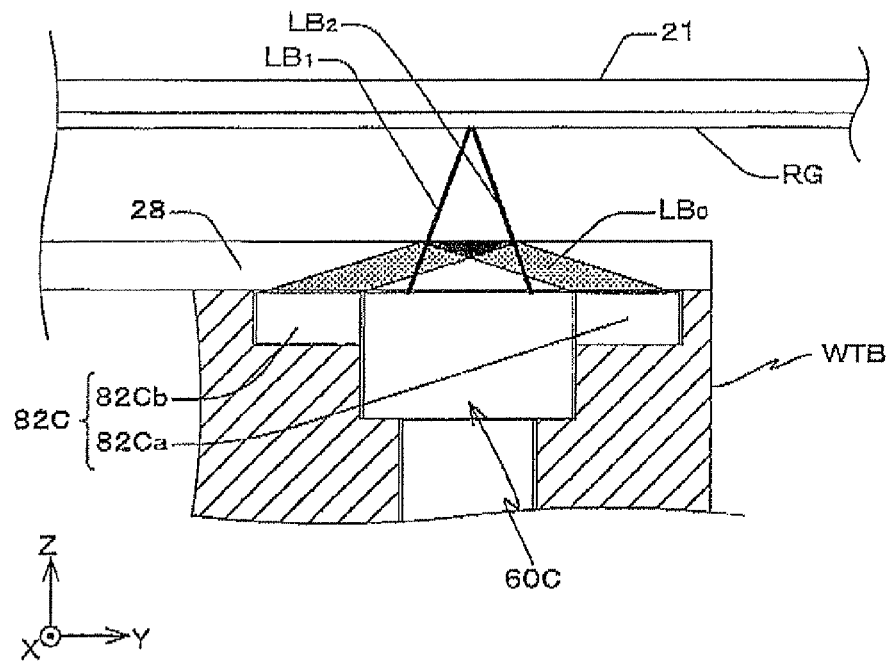
FIGS. 7A to 7B are views used to explain a modified example of the liquid detecting device.
Figure 7B:
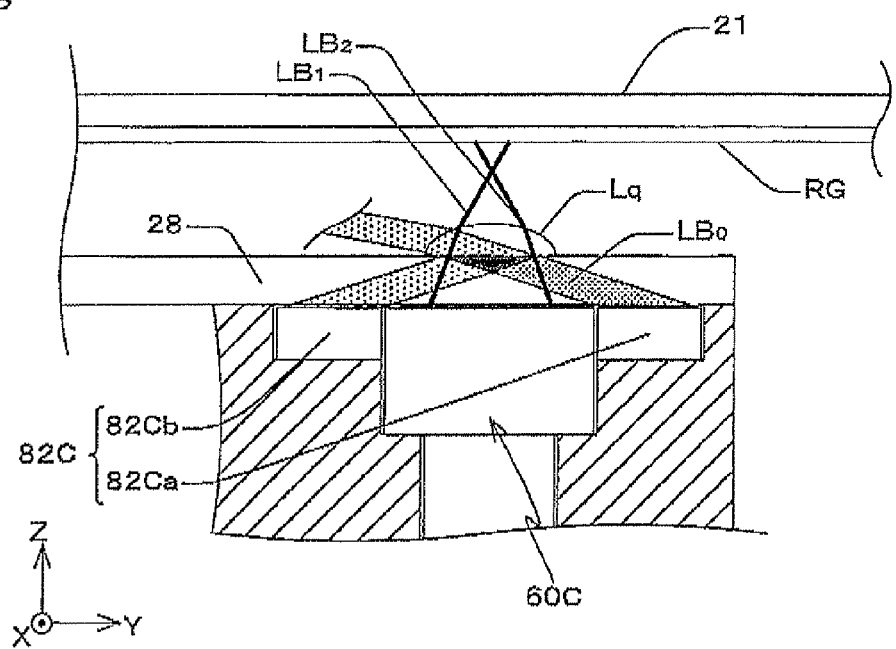

FIGS. 7A and 7B show a liquid detecting sensor 82C arranged on head 60C, as an example of a liquid detecting sensor individually arranged on heads 60A to 60D. Liquid detecting sensor 82C includes an irradiation system 82Ca and a photodetection system 82Cb which are placed proximate to a housing of head 60C, inside wafer table WTB. Irradiation system 82Ca and photodetection system 82Cb are covered by plate 28, along with head 60C. In this case, liquid detecting sensor 82C has a plurality of detection points (or detection areas) in an area (more specifically, the photodetection surface of head 60C) above the upper surface of plate 28 where measurement beams $LB_1$ and $LB_2$ irradiated on scale plate 21 (diffraction grating RG) from head 60C and diffraction beams of measurement beams $LB_1$ and $LB_2$ from diffraction grating RG pass through.

Irradiation system 82Ca irradiates a measurement beam $LB_0$ which is obliquely incident on each of the plurality of detection points on the upper surface of plate 28. In this case, as shown in FIG. 7A, the angle of the oblique light incidence is set so that measurement beam $LB_0$ is totally reflected when there is no liquid Lq remaining on plate 28. Photodetection system 82Cb receives the reflected light of measurement beam $LB_0$ from the upper surface of plate 28. In this case, as shown in FIG. 7B, when liquid Lq remains on plate 28, because a part of measurement beam $LB_0$ leaks from wafer table WTB via liquid Lq, the total light quantity of the reflected light from the plurality of detection points detected by photodetection system 82Cb decreases. Therefore, main controller 20 can detect the residual state (for example, residual presence) of the liquid on the photodetection surface of head 60C using liquid detecting sensor 82C by detecting such a change in the total light quantity.

By arranging a liquid detecting sensor similar to liquid detecting sensor 82C on all of the heads individually, main controller 20 can constantly detect whether there is any residual liquid or not on the photodetection surface of the head, not to mention during an idle status of the apparatus, at the time of wafer exchange and the like, without limiting the detection to the time right after the head has passed through liquid immersion area ALq. Further, in this case, the liquid detecting sensor can be arranged on each head, regardless of the number of heads.

Further, in the description so far, the example was described where main controller 20 detects whether there is any residual liquid or not on the photodetection surface of the head by a change in light quantity of the reflected light, which is detected using liquid detecting device 80. However, if the amount of residual liquid is small, there may be a case when the head does not completely lose its function, and the measurement itself of the positional information is possible although errors occur in the measurement values. In this case, the error may be within a permissible level. Therefore, for example, the amount of the residual liquid on the photodetection surface of the head can also be measured by the change in light quantity of the reflected light which has been detected, using liquid detecting device 80. In this case, the permissible amount of the residual liquid is to be obtained in advance by experiment and the like, based on permissible values of the measurement errors beforehand, and the amount of the residual liquid which has been obtained is to be set as a threshold. Then, if the residual amount of liquid is less than the threshold, main controller 20 begins to use the head again, judging that although errors occur, the errors are within a permissible level. Meanwhile, in the case the residual amount of liquid exceeds the amount of the threshold value, main controller 20 can judge that the errors are not permissible, or more specifically, that the head does not function properly, and can decide not to use the head.

Incidentally, in the first embodiment described above, while the example has been described where two-dimensional diffraction grating RG was formed on the lower surface of scale plate 21, as well as this, a scale plate which has two one-dimensional diffraction gratings whose periodic direction is in the Y-axis direction and the X-axis direction, respectively, can be arranged instead of scale plate 21. In this case, the one-dimensional diffraction grating whose periodic direction is in the Y-axis direction should cover the area where Y heads 60A and 60C may face each other by the movement of wafer stage WST, and the one-dimensional diffraction grating whose periodic direction is in the X-axis direction should cover the area where X heads 60B and 60D may face each other.

Incidentally, as a cause of output abnormality of the head, besides the entry into liquid immersion area ALq and liquid Lq remaining on the photodetection surface of the head as is previously described, causes such as foreign material such as dust and the like adhering on the head and interrupting the measurement beam, or malfunction occurring in the head and the like can also be considered. In the case four one-dimensional heads are provided on wafer table WTB as in the embodiment above, while it is necessary to perform measurement of the positional information of wafer stage WST within the XY plane using three heads located outside the liquid immersion area, the foreign material adhesion described above may occur in one of the three heads. In consideration of such a situation, five or more one-dimensional heads may be installed on the wafer table, as in the second embodiment below.

A Second Embodiment

Next, a second embodiment of the present invention will be described, referring to FIG. 8. Here, the same reference numerals will be used for the same or similar sections as in the first embodiment previously described, and a detailed description thereabout will be simplified or omitted.

The exposure apparatus of the second embodiment is different from exposure apparatus 100 of the first embodiment previously described in the configuration of the encoder system which measures the positional information of wafer stage WST, especially in the placement of encoder heads on wafer stage WST and the configuration of scale plates, and as for other sections, the configuration and the like is the same. Accordingly, in the description below, the second embodiment will be described, focusing mainly on such differences. Incidentally, in the exposure apparatus of the second embodiment, liquid detecting sensors similar to liquid detecting sensor 82C (refer to FIGS. 7A and 7B) previously described are provided in the plurality of heads which will be described later on. More specifically, liquid detecting device 80 previously described is not provided.

Figure 8:
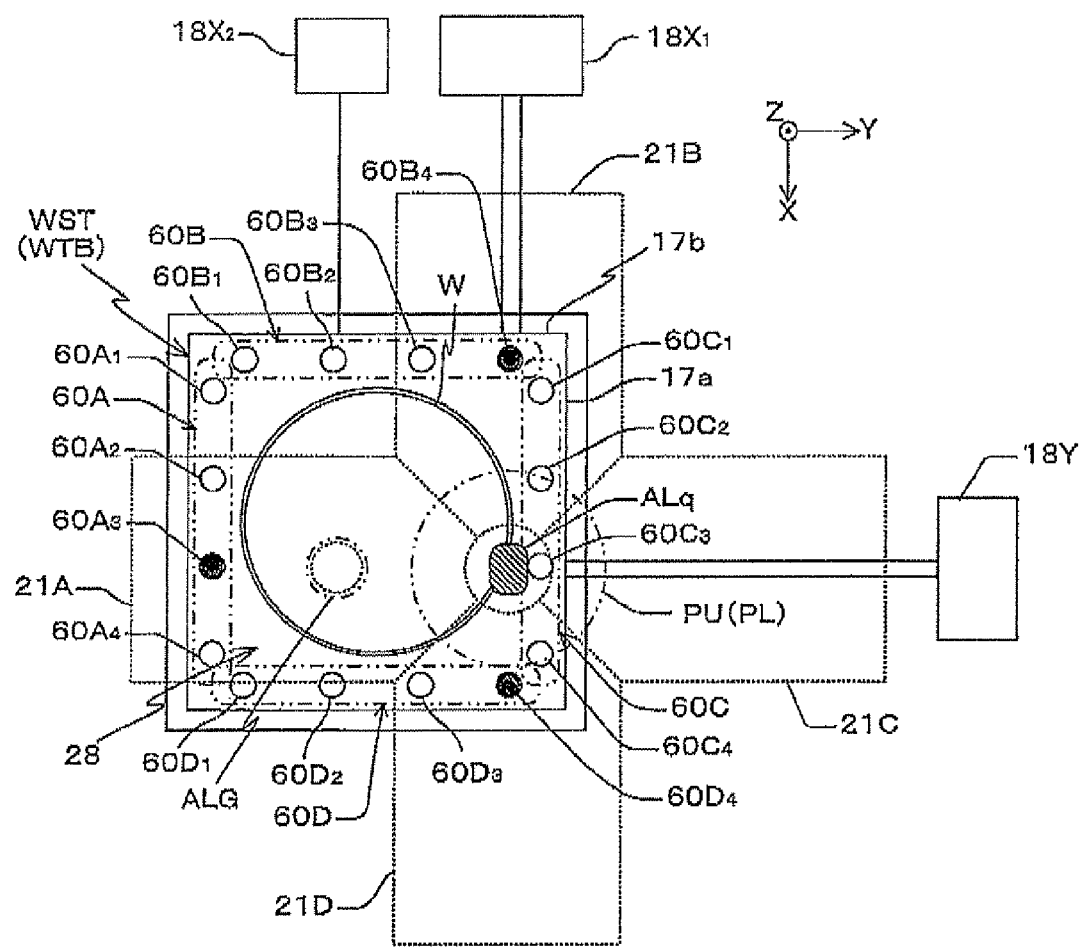
FIG. 8 is a view that shows an exposure apparatus of a second embodiment.

FIG. 8 shows a partially omitted planar view of an exposure apparatus of the second embodiment. As shown in FIG. 8, in the exposure apparatus of the second embodiment, four heads are placed along the four sides on the upper surface of wafer table WTB (wafer stage WST), respectively. More specifically, in the vicinity of one side of the upper surface of wafer table WTB on the −Y side, four heads $60A_1$ to $60A_4$ configuring a head unit 60A are placed at a predetermined distance along the side. Heads $60A_1$ to $60A_4$ are placed at a distance larger than the width of liquid immersion area ALq in the X-axis direction. Similarly, in the vicinity of the sides on the upper surface of wafer table WTB on the −X side, the +Y side, and the +X side, four heads $60B_1$ to $60B_4$ configuring a head unit 60B, four heads $60C_1$ to $60C_4$ configuring a head unit 60C, and four heads $60D_1$ to $60D_4$ configuring a head unit 60D are placed along the respective sides at a predetermined distance. The heads belonging to the same head unit are placed at a distance larger than the width of liquid immersion area ALq in the arrangement direction.

Further, in the exposure apparatus of the second embodiment, instead of scale plate 21 previously described, four scale plates 21A, 21B, 21C, and 21D which correspond to head units 60A, 60B, 60C, and 60D respectively are arranged. Scale plates 21A, 21B, 21C, and 21D are placed on the −Y side, the −X side, the +Y side, and the +X side on the lower end of projection optical system PL, respectively. On the lower surface (the surface on the −Z side) of scale plates 21A and 21C, a one-dimensional diffraction grating whose periodic direction is in the Y-axis direction is formed. Further, on the lower surface of scale plates 218 and 21D, a one-dimensional diffraction grating whose periodic direction is in the X-axis direction is formed.

Each head belonging to head units 60A to 60D irradiates a measurement beam (measurement beams) on the corresponding scale plates 21A to 21D, respectively, and by receiving the diffraction light which occurs by the irradiation, configures an encoder (70A to 70D) which measures positional information of wafer stage WST in each measurement direction. The width of scale plates 21A to 21D is sufficiently longer than the distance between heads adjacent to each other belonging to a corresponding head unit, and two or more heads belonging to a corresponding head unit can simultaneously face a scale plate.

In the state shown in FIG. 7, three Y heads $60A_2$, $60A_3$, and $60A_4$ of the four heads belonging to head unit 60A face scale plate 21A. Further, of each of the four heads belonging to head units 60B and 60D, two X heads each, which are X heads $60B_3$ and $60B_4$, and $60D_3$ and $60D_4$ face scale plates 21B and 21D, respectively. Meanwhile, none of the four heads belonging to head unit 60C face scale plate 21C. Further, at this point, head $60C_3$ approaches liquid immersion area ALq.

In this case, main controller 20 judges whether any of the heads have approached (or entered) liquid immersion area ALq or not, based on positional information of wafer stage WST measured using wafer interferometer system 18 (or the encoder system) as is previously described, and judges that head $60C_3$ has approached liquid immersion area ALq. Then, main controller 20 further excludes the head whose output is abnormal from the remaining heads besides head $60C_3$. The heads having output abnormality include heads having foreign materials such as dust adhering on the head, in addition to heads which were detected to have liquid remaining (or liquid remaining that exceeds a threshold residual amount) by the liquid detecting sensors provided in each of the heads. The adhesion of such foreign materials can also be detected using liquid detecting device 80 previously described, as is obvious from the detection principle.

Then, main controller 20 selects the necessary number of heads, such as, for example, three heads, from the remaining plurality of heads.

For example, in the case of FIG. 7, main controller 20 selects Y head $60A_3$ from Y heads $60A_2$, $60A_3$, and $60A_4$ facing scale plate 21A, X head $60B_4$ from X heads $60B_3$ and $60B_4$ facing scale plate 21B, and X head $60D_4$ from X heads $60D_3$ and $60D_4$ facing scale plate 21D, respectively.

Then, main controller 20 uses the measurement values of the three heads $60A_3$, $60B_4$, and $60D_4$ (encoders 70A, 70B, and 70D) to obtain the positional information of wafer table WTB (wafer stage WST).

As described, of the plurality of heads, main controller 20 selects three heads (encoders) out of the remaining heads that exclude the head in proximity to (or has entered) liquid immersion area ALq, and furthermore, the head which is located outside liquid immersion area ALq but outputs abnormal measurement values, and by using the measurement values of the three heads, obtains the positional information of wafer table WTB (wafer stage WST).

According to the exposure apparatus of the second embodiment that is configured and functions in the manner described above, besides being able to obtain a similar effect as exposure apparatus 100 of the first embodiment previously described, the head which does not function properly due to adhesion of foreign materials other than the liquid will not be used for position control of wafer stage WST.

Incidentally, in the first and second embodiments described above, as each of the heads 60A to 60D (encoders 70A to 70D), while a one-dimensional encoder whose measurement direction is only in one direction (in the X-axis direction or the Y-axis direction) was employed, besides such an encoder, a two-dimensional encoder whose measurement direction is in both the X-axis direction and the Y-axis direction can also be employed. In this case, main controller 20 can obtain positional information (including information on the θz rotation quantity) of wafer table WTB (wafer stage WST) in the XY plane, for example, using measurement values of at least two encoders (more specifically, at least two encoders which output effective measurement values) facing the lower surface of scale plate 21 previously described on which diffraction grating RG is formed.

Incidentally, the placement of the encoders (heads) on the wafer stage in the first and second embodiment above is a mere example, and the present invention is not limited to this. For example, an encoder and a backup encoder can be placed on each of the four corners of the wafer stage along a radial direction from the stage center.

Further, in the case of placing an encoder head on a surface of a movable body such as wafer table WTB (wafer stage WST), a main section of the head can be placed inside the movable body while only the light-receiving section is placed on the surface.

Further, in the first and second embodiments, while the case has been described where a liquid detection sensor was arranged, the liquid detection sensor does not necessarily have to be arranged. In this case, an output and the like of the encoder can be used instead, or the head which obviously comes into contact with the liquid in the exposure sequence can simply be changed in advance to other heads, without performing any of the liquid detection. In this case, if abnormality does not occur in the output of the former head, the head can be changed again to the former head (reused).

Incidentally, in the exposure apparatus of the first and second embodiments, the head exchange can be performed similarly, not only during the exposure operation but also during other operations, such as, for example, reference mark detection, or measurement using a sensor on the water stage (such as an uneven illumination measuring sensor, an aerial image measuring sensor, an irradiation measuring sensor, a polarization sensor, a wavefront measurement sensor and the like). However, the wafer stage will need to have at least one measurement member (such as a sensor), and a liquid immersion domain will have to be formed on the wafer stage.

Further, the head exchange can be applied similarly, also in the case of measuring positional information of a measurement stage using an encoder in an exposure apparatus equipped with the measurement stage which will be described later on.

Incidentally, in the first and second embodiments, a sensor (or a head) which can measure positional information in the Z-axis direction can be used together, or a sensor (or a head) which can measure positional information in the X-axis direction and Y-axis direction, or a sensor (an X sensor) whose measurement direction is in the X-axis direction and a sensor (a Y sensor) whose measurement direction is in the Y-axis direction can be used in combination.

Besides this, an encoder which can measure positional information in at least one of the X-axis direction and the Y-axis direction, and the Z-axis direction can also be used.

Further, for example, in an exposure apparatus whose projection optical system and alignment system are spaced apart, different scale plates can be provided in the vicinity (periphery) of the projection optical system and in the vicinity (periphery) of the alignment system. In this case, when exposure operation of wafer W is performed, the position of the wafer stage is measured by the encoder system, using the scale board placed in the vicinity of the projection optical system, and on wafer alignment and the like, the position of the wafer stage is measured by the encoder system, using the scale board placed in the vicinity of the alignment system.

Further, in the embodiment above, while the case has been described where a wafer interferometer system was arranged in addition to the encoder system, the wafer interferometer system does not necessarily have to be arranged.

Incidentally, in each of the embodiments above, the case has been described where the present invention is applied to a scanning stepper; however, the present invention is not limited to this, and can also be applied to a static exposure apparatus such as a stepper. Even if the present invention is applied to a stepper, by measuring the position of the stage on which the object subject to exposure is mounted using an encoder, position measurement error caused by air fluctuation can substantially be nulled, which is different from when measuring the position of the stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area. Moreover, the present invention can also be applied to a multi-stage type exposure apparatus equipped with a plurality of wafer stages, as is disclosed in, for example, the U.S. Pat. No. 6,590,634 description, the U.S. Pat. No. 5,969,441 description, the U.S. Pat. No. 6,208,407 description and the like. Further, the present invention can also be applied to an exposure apparatus equipped with a measurement stage including a measurement member (for example, a reference mark, and/or a sensor and the like) different from the wafer stage, as disclosed in, for example, International Publication No. 2005/074014.

Further, the magnification of the projection optical system in the exposure apparatus in each of the embodiments above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image.

Further, illumination light IL is not limited to an ArF excimer laser beam (wavelength 193 nm), and can also be an ultraviolet light such as the KrF excimer laser beam (wavelength 248 nm), or a vacuum-ultraviolet light such as the $F_2$ laser beam (wavelength 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in each of the embodiments above, illumination light IL of the exposure apparatus is not limited to the light having a wavelength equal to or more than 100 nm, and it is needless to say that the light having a wavelength less than 100 nm can be used. For example, the present invention can be applied to an EUV exposure apparatus that uses an EUV (Extreme Ultraviolet) light in a soft X-ray range (e.g. a wavelength range from 5 to 15 nm). Besides such an apparatus, the present invention can also be applied to an exposure apparatus that uses charged particle beams such as an electron beam or an ion beam.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as each of the embodiments above can be obtained by measuring the position of the stage using an encoder.

Further, as is disclosed in, for example, International Publication No. 2001/035168, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in each of the embodiments and the modified example above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the disclosures of the various publications (including Published PCT International Applications), and the U.S. Patent Application Publication descriptions and the U.S. Patent descriptions that are cited in the description so far related to exposure apparatuses and the like are each incorporated herein by reference.

Incidentally, semiconductor devices are manufactured through the steps of; a step where the function/performance design of the device is performed, a step where a reticle based on the design step is manufactured, a step where a wafer is manufactured from silicon materials, a lithography step where the pattern formed on a mask is transferred onto an object such as the wafer by the exposure apparatus in the embodiment above, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, because the exposure apparatus in the embodiment above is used in the lithography step, devices having high integration can be produced with good yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present intention, which is best defined by the claims appended below.

What is claimed is:

1. An exposure apparatus apparatus comprising:
a movable body which holds an object and substantially moves along a predetermined plane;
a liquid supply device which supplies liquid on a surface of the movable body on which the object is mounted including a surface of the object;
a pattern generation device including an optical system which has liquid supplied to a space formed with the surface of the movable body, the pattern generation device irradiating an energy beam on the object via the optical system and the liquid and forming a pattern on the object;
a measurement system which includes an encoder system that has a plurality of encoder heads placed on the surface of the movable body and that measures positional information of the movable body, based on an output of a predetermined number of the encoder heads facing a grating section placed parallel to the predetermined plane external to the movable body; and
a detection device which is connected to the measurement system, and for at least one of the plurality of encoder heads, detects residual information of the liquid on a photodetection section of the encoder head and outputs the detection results to the measurement system, wherein
the encoder system measures positional information of the movable body within the predetermined plane based on an output of the predetermined number of the encoder heads except for an encoder head which was detected to have liquid remaining by the detection device.

2. The exposure apparatus according to claim 1 wherein the measurement system further includes an interferometer system which measures positional information of the movable body at least within the predetermined plane.

3. The exposure apparatus according to claim 1 wherein the detection device detects the residual information of the liquid by irradiating a measurement beam on a surface of the movable body, receiving a reflected light from the surface, and measuring the light quantity of the reflected light.

4. The exposure apparatus according to claim 3 wherein the detection device irradiates the measurement beam which is obliquely incident on the surface of the movable body.

5. The exposure apparatus according to claim 1 wherein the detection device is placed external to the movable body.

6. The exposure apparatus according to claim 5 wherein the detection device has a detection area in a vicinity of a liquid immersion area formed by the liquid.

7. The exposure apparatus according to claim 6 wherein the detection area surrounds a periphery of the liquid immersion area.

8. The exposure apparatus according to claim 1 wherein the plurality of encoder heads include a first head and a second head whose measurement directions are in a first direction and in a second direction, respectively, which are orthogonal to each other in the predetermined plane, and
the encoder system measures positional information of the movable body within the predetermined plane, based on an output of at least three encoder heads which include at least one of each of the first and second heads.

9. The exposure apparatus according to claim 8 wherein the grating section includes a first diffraction grating which covers a range where the first head may face and whose periodic direction is in the first direction and a second diffraction grating which covers a range where the second head may face and whose periodic direction is in the second direction.

10. The exposure apparatus according to claim 8 wherein the grating section includes a two-dimensional grating which covers a range where the first and second heads may face and whose periodic direction is in the first and second directions.

11. The exposure apparatus according to claim 1 wherein the plurality of encoder heads include a two-dimensional head whose measurement directions are both in a first direction and in a second direction, which are orthogonal to each other in the predetermined plane, and
the encoder system measures positional information of the movable body within the predetermined plane based on an output of at least two of the two-dimensional heads.

12. The exposure apparatus according to claim 11 wherein the grating section includes a two-dimensional grating which covers a range where the two-dimensional head may face and whose periodic direction is in the first and second directions.

13. The exposure apparatus according to claim 1, the apparatus further comprising:
a drive system which drives the movable body based on positional information of the movable body within the predetermined plane.

14. An exposure apparatus comprising:
a movable body which holds an object and substantially moves along a predetermined plane;
a liquid supply device which supplies liquid on a surface of the movable body on which the object is mounted including a surface of the object:
a pattern generation device including an optical system which has liquid supplied to a space formed with the surface of the movable body, the pattern generation device irradiating an energy beam on the object via the optical system and the liquid and forming a pattern on the object;
a measurement system which includes an encoder system that has a plurality of encoder heads placed on the surface of the movable body and that measures positional information of the movable body, based on an output of a predetermined number of the encoder heads facing a grating section placed parallel to the predetermined plane external to the movable body; and
a detection device which is connected to the measurement system, and for at least one of the plurality of encoder heads, detects residual information of the liquid on a photodetection section of the encoder head and outputs the detection results to the measurement system, wherein
the detection device detects the residual information of the liquid for an encoder head which has passed through a liquid immersion area formed by the liquid, based on the positional information of the movable body within the predetermined plane measured by the measurement system.

15. An exposure apparatus comprising:
a movable body which holds an object and substantially moves along a predetermined plane:
a liquid supply device which supplies liquid on a surface of the movable body on which the object is mounted including a surface of the object:
a pattern generation device including an optical system which has liquid supplied to a space formed with the surface of the movable body, the pattern generation device irradiating an energy beam on the object via the optical system and the liquid and forming a pattern on the object;
a measurement system which includes an encoder system that has a plurality of encoder heads placed on the surface of the movable body and that measures positional information of the movable body, based on an output of a predetermined number of the encoder heads facing a grating section placed parallel to the predetermined plane external to the movable body; and
a detection device which is connected to the measurement system, and for at least one of the plurality of encoder heads, detects residual information of the liquid on a photodetection section of the encoder head and outputs the detection results to the measurement system, wherein
the detection device is provided in each of the plurality of encoder heads.

16. The exposure apparatus according to claim 15 wherein the detection device has a detection area on each of the encoder heads.

17. An exposure apparatus comprising:
a movable body which holds an object and substantially moves along a predetermined plane;
a liquid supply device which supplies liquid on a surface of the movable body on which the object is mounted including a surface of the object;
a pattern generation device including an optical system which has liquid supplied to a space formed with the surface of the movable body, the pattern generation device irradiating an energy beam on the object via the optical system and the liquid and forming a pattern on the object;
a measurement system which includes an encoder system that has a plurality of encoder heads placed on the surface of the movable body and that measures positional information of the movable body, based on an output of a predetermined number of the encoder heads facing a grating section placed parallel to the predetermined plane external to the movable body; and
a detection device which is connected to the measurement system, and for at least one of the plurality of encoder heads, detects residual information of the liquid on a photodetection section of the encoder head and outputs the detection results to the measurement system, wherein
the surface of the movable body is covered with a light transmission member which forms a substantially flush surface with the object with a small gap in between, and covers the plurality of encoder heads.

18. An exposure method in which an energy beam is irradiated on an object via an optical system and liquid, and a pattern is formed on the object, the method comprising:
a measurement process in which, of a plurality of encoder heads placed on a surface of a movable body where the object is mounted and that substantially moves along a predetermined plane, positional information of the movable body is measured, based on an output of a predetermined number of the encoder heads facing a grating section placed parallel to the predetermined plane external to the movable body; and
a detection process in which residual information of the liquid on a photodetection section of the encoder head is detected for at least one of the plurality of encoder heads, wherein
in the measurement process, the positional information of the movable body within the predetermined plane is measured, based on an output of the predetermined number of the encoder heads except for an encoder head which was detected to have liquid remaining in the detection process.

19. The exposure method according to claim 18 wherein
the plurality of encoder heads include a first head and a second head whose measurement directions are in a first direction and in a second direction, respectively, which are orthogonal to each other in the predetermined plane, and
in the measurement process, positional information of the movable body within the predetermined plane is measured, based on an output of at least three encoder heads which include at least one of each of the first and second heads.

20. The exposure method according to claim 18 wherein
the plurality of encoder heads include a two-dimensional head whose measurement directions are both in a first direction and in a second direction, which are orthogonal to each other in the predetermined plane, and
in the measurement process, positional information of the movable body within the predetermined plane is measured, based on an output of at least two of the two-dimensional heads.

21. A device manufacturing method, the method including:
a process in which a pattern is formed on the object by the exposure method according to claim 18; and
a process in which the object on which the pattern has been formed is developed.

22. An exposure method comprising:
a measurement process in which, of a plurality of encoder heads placed on a surface of a movable body where an object is mounted and that substantially moves along a predetermined plane positional information of the movable body is measured, based on an output of a predetermined number of the encoder heads facing a grating section placed parallel to the predetermined plane external to the movable body; and
a detection process in which residual information of the liquid on a photodetection section of the encoder head is detected for at least one of the plurality of encoder heads, wherein
in the detection process, residual information of the liquid is detected for an encoder head which has passed through a liquid immersion area formed by the liquid, based on positional information of the movable body within the predetermined plane.

* * * * *

UNITED STATES PATENT AND TRADEMARK OFFICE
CERTIFICATE OF CORRECTION

| | | |
|---|---|---|
| PATENT NO. | : 8,228,482 B2 | Page 1 of 1 |
| APPLICATION NO. | : 12/463586 | |
| DATED | : July 24, 2012 | |
| INVENTOR(S) | : Yuho Kanaya | |

It is certified that error appears in the above-identified patent and that said Letters Patent is hereby corrected as shown below:

On the cover of the Patent, under (56) References Cited, U.S. PATENT DOCUMENTS, include:

-- 2006/0132737 A1* 6/2006 Magome et al. --

Signed and Sealed this
Sixth Day of November, 2012

David J. Kappos
*Director of the United States Patent and Trademark Office*